United States Patent
Yach

(10) Patent No.: US 7,209,926 B2
(45) Date of Patent: Apr. 24, 2007

(54) METHODS AND APPARATUS FOR LEXICOGRAPHICALLY SORTING CYCLIC DATA

(75) Inventor: David P. Yach, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 546 days.

(21) Appl. No.: 10/689,901

(22) Filed: Oct. 21, 2003

(65) Prior Publication Data

US 2004/0139118 A1 Jul. 15, 2004

Related U.S. Application Data

(60) Provisional application No. 60/420,731, filed on Oct. 24, 2002.

(51) Int. Cl.
G06F 17/30 (2006.01)

(52) U.S. Cl. ............... 707/101; 707/1; 707/104.1

(58) Field of Classification Search ............ 707/1–10, 707/100–104.1, 200–206; 375/240; 341/107
See application file for complete search history.

(56) References Cited

U.S. PATENT DOCUMENTS

| | | | | |
|---|---|---|---|---|
| 5,790,599 | A * | 8/1998 | Wright et al. ............... | 375/240 |
| 6,075,470 | A * | 6/2000 | Little et al. ................ | 341/107 |
| 6,751,624 | B2 * | 6/2004 | Christal et al. ............ | 707/101 |
| 2001/0051941 | A1 * | 12/2001 | Tonomura .................... | 707/3 |

FOREIGN PATENT DOCUMENTS

| | | |
|---|---|---|
| WO | WO 99/05828 | 2/1999 |
| WO | WO 99/23836 | 5/1999 |
| WO | WO 2004/043098 A | 5/2004 |
| WO | WO 2004/084568 A | 9/2004 |

OTHER PUBLICATIONS

Sadakane, K., "A Fast Algorithm for Making Suffix Arrays and for Burrows-Wheeler Transformation," Data Compression Conference, 1998 IEEE, pp. 129-138.

Mukherjee, A., et al., "Prototyping of Efficient Hardware Algorithms for Data Compression in Future Communication Systems," Proceedings 12th International Workshop on Rapid System Prototyping, 2001 IEEE, pp. 58-63.

(Continued)

Primary Examiner—Yicun Wu
(74) Attorney, Agent, or Firm—John J. Oskorep, Esq.

(57) ABSTRACT

Methods and apparatus for lexicographically sorting cyclic data are disclosed. In one illustrative example, a method of lexicographically sorting data includes the acts of receiving a set of N cyclic shifts of N characters identifiable by an array of indexes $\{0, 1, 2, \ldots, N-1\}$; sorting the set of cyclic shifts based on a comparison of a first character of each cyclic shift; and for an nth sorting iteration of the set of cyclic shifts, where $n=1, 2, 3, \ldots$, up to $2^n > N$: sorting at least a subset of the cyclic shifts which are identifiable by a subset array of indexes in the array in accordance with a previous sort of cyclic shifts associated with the subset array of indexes plus $2^{(n-1)} *$modulo(N); and repeating the sorting for a next nth sorting iteration as necessary until the set of cyclic shifts are lexicographically sorted.

13 Claims, 5 Drawing Sheets

OTHER PUBLICATIONS

Manber, U., et al., "Suffix Arrays: A New Method For On-Line String Searches," Siam Journal on Computing, Society for Industrial and Applied Mathematics, 1993, vol. 22, No. 5, pp. 935-948.

Nelson, M., "Data Compression with the Burrows Wheeler Transform," Dr. Dobb's Journal, M&T Publ., Redwood City, CA, US, vol. 21, No. 9, Sep. 1996, pp. 46-50.

3rd Generation Partnership Project: 3GPP"Technical Specification Group Services and System Aspects",Mar. 2004, 35 pgs, retreived from http://www.3gpp.org.

International Search Report & Written Opinion for PCT Application PCT/IB2005/002217, Jan. 5, 2005.

* cited by examiner

METHODS AND APPARATUS FOR LEXICOGRAPHICALLY SORTING CYCLIC DATA

CROSS-REFERENCE TO RELATED APPLICATION

This application claims benefit of U.S. Provisional Application Ser. No. 60/420,731 filed on Oct. 24, 2002, the entire disclosure of which is incorporated herein by reference.

BACKGROUND

1. Field of the Invention

This invention relates generally to the field of data compression, and specifically to a multi-stage block-wise adaptive statistical data compressor that includes a lexicographical sorting stage.

2. Description of the Related Art

Data compression (or compression) refers to the process of transforming a data file or stream of data characters so that the number of bits needed to represent the transformed data is smaller than the number of bits needed to represent the original data. The reason that data files can be compressed is because of redundancy. The more redundant a particular file is, the more likely it is to be effectively compressed.

A known block-wise adaptive statistical data compressor adapts its data model on a block-by-block basis. The data model generated by the adaptive statistical data compressor consists of a plurality of super-character codewords that correspond to a plurality of super-character groups, wherein each super-character group contains data regarding the frequency of occurrence of one or more individual characters in an applicable character data set. The use of these super-character codewords and groups to model the data in a particular block minimizes the amount of model data that must be included with the compressed data block to enable decompression.

A multi-stage data compressor that includes the block-wise adaptive statistical data compressor as one stage is also known, and includes a clustering stage and a reordering stage, which, together, reformat data in a data block so that the frequency distribution of characters in the data block has an expected skew. This skew is then exploited by selecting certain super-character groupings that optimize the compression ratio achievable by the block-wise adaptive statistical stage. The clustering stage in such a multi-stage compressor may be implemented using the Burrows-Wheeler Transform ("BWT"). A BWT clustering stage includes a stage of using a known generic sorting algorithm, such as the radix sort or the quick sort, to sort cyclic shifts. These sorting algorithms are generic in that they can sort any data, and are not specifically suited to sorting cyclic shifts.

SUMMARY

Methods and apparatus for lexicographically sorting cyclic data are described herein. In one illustrative example, a method of lexicographically sorting data includes the acts of receiving a set of N cyclic shifts of N characters identifiable by an array of indexes $\{0, 1, 2, \ldots, N-1\}$; sorting the set of cyclic shifts based on a comparison of a first character of each cyclic shift; and for an nth sorting iteration of the set of cyclic shifts, where $n=1, 2, 3, \ldots$, up to $2^n > N$: sorting at least a subset of the cyclic shifts which are identifiable by a subset array of indexes in the array in accordance with a previous sort of cyclic shifts associated with the subset array of indexes plus $2^{(n-1)} * \text{modulo}(N)$; and repeating the sorting for a next nth sorting iteration as necessary until the set of cyclic shifts are lexicographically sorted.

DETAILED DESCRIPTION OF THE PREFERRED EMBODIMENTS

A method of lexicographically sorting a plurality of cyclic shifts of a data block is provided. The method starts by initially sorting the cyclic shifts based on the first character of each of the cyclic shifts. The method continues by performing iterations of an index sorting procedure until all the characters in the cyclic shifts have been sorted, or until there are no equivalent cyclic shifts. Equivalent cyclic shifts have a common leading sequence of sorted characters. The $n^{th}$ iteration of the index sorting procedure comprises sorting the equivalent cyclic shifts according to the sort order of the indexes of cyclic shifts starting with the $(2^{n-1}+1)^{th}$ characters of the equivalent cyclic shifts. A lexicographical sorter is also provided. The lexicographical sorter includes an initial sort stage, which receives a plurality of unsorted cyclic shifts of a data block, sorts the cyclic shifts based on the first character of each cyclic shift, and outputs the cyclic shifts which are sorted by the first character of each cyclic shift.

The lexicographical sorter also includes an iterative sorting stage, which receives the cyclic shifts which are sorted by the first character from the initial sorting stage, performs a plurality of sorting iterations until there are no cyclic shifts that are considered to be equivalent by the initial sort stage or by the previous sorting iteration, or until all of the characters in the cyclic shifts are sorted, and then outputs the cyclic shifts sorted in lexicographical order. The $n^{th}$ sorting iteration sorts the next $2^{n-1}$ unsorted characters of the cyclic shifts that were considered to be equivalent by locating each of the $2^{n-1}$ characters in the results of the initial sorting iteration, if the sorting iteration is the first iteration of the iterative sorting step, or of the previous sorting iteration, if the sorting iteration is not the first iteration of the iterative sorting step. The cyclic shifts that were considered to be equivalent are then reordered based on the order of each of the $2^{n-1}$ characters that are located in the results of initial sort stage or in the previous sorting iteration. This sorting is accomplished without actually comparing the $2^{n-1}$ characters, but instead by the much more computer-efficient comparison of integer values.

Figure 1:
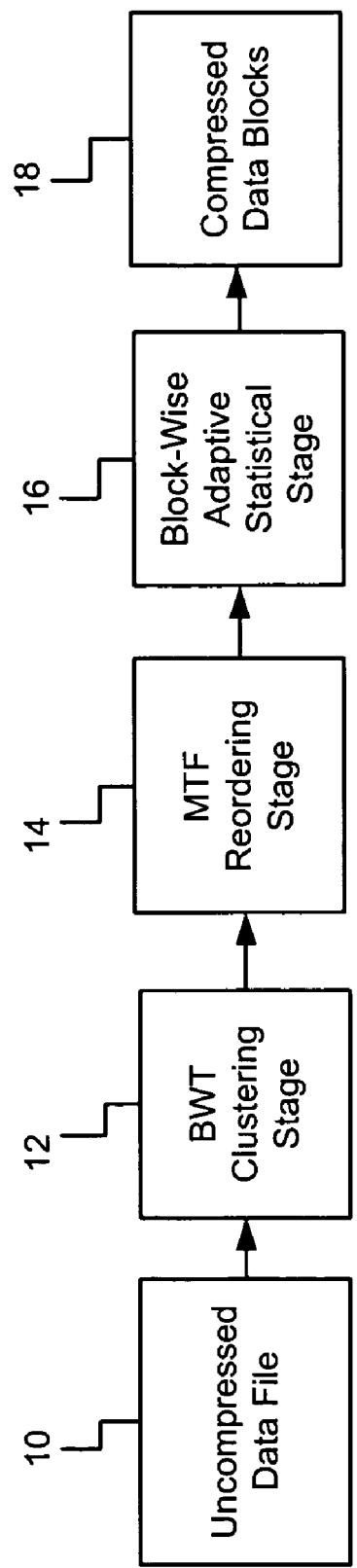
FIG. 1 is a block diagram of a multi-stage lossless data compressor including a Burrows-Wheeler Transform (BWT) clustering stage, a Move-To-Front (MTF) reordering stage, and a block-wise adaptive statistical stage.

Referring now to the drawings, FIG. 1 is a block diagram of a multi-stage lossless data compressor including a Burrows-Wheeler Transform ("BWT") clustering stage 12, a Move-To-Front ("MTF") reordering stage 14, and a block-wise adaptive statistical stage 16. Although not shown explicitly in FIG. 1, an uncompressed data file 10 is first broken into blocks of some particular size, preferably from 512 to 4096 bytes, but could, alternatively, be partitioned into any other size block. Each block is then transformed by the clustering stage 12 and the reordering stage 14 prior to being compressed by the block-wise adaptive statistical stage 16, resulting in a sequence of compressed data blocks 18.

As will be described in more detail below, the clustering stage 12 provides the function of grouping or clustering similar characters in adjacent locations within the data block. The clustering stage 12 does not segregate all of a particular character in a particular location within the block, but rather segregates particular characters in several sub-blocks within the data block. For example, a typical sequence of characters in the clustered data block could be "ttTwWttwwTTWww."

The clustering stage employs the Burrows-Wheeler Transform (BWT), which is described in more detail below in relation to FIG. 3. The BWT algorithm is specifically described in "A Block Sorting Lossless Data Compression Algorithm," SRC Research Report, May 1994, by M. Burrows and D. J. Wheeler, and also in "Data Compression with the Burrows-Wheeler Transform," Dr. Dobb's Journal, September, 1996, by Mark Nelson, both of which are incorporated herein by reference. The BWT algorithm provides the desired function of transforming the data block so that similar characters are clustered together in certain locations of the block. Although the BWT algorithm is a preferred method of clustering characters in the data blocks, other techniques could be used to provide the desired function noted above.

Once the data has been rearranged by the clustering stage 12, it is passed to the reordering stage 14, which replaces the character data in the data block with a set of numerical values that tend to have a skewed frequency distribution. These numerical values correspond to the current position of a character being processed in a queue of all the characters in the associated character lexicon. The position of any character in the queue changes based upon the frequency of occurrence of that character, with frequently occurring characters appearing at the top of the queue where the index value is a small number. The net result of the reordering stage 14 is that the rearranged data block of characters output by the BWT clustering stage 12 is replaced by a reordered block of numbers that are characterized by an expected frequency distribution that is skewed such that low numbers are significantly more likely to appear in the data block than high numbers. The first two stages 12, 14 are particularly useful in essentially pre-formatting the data into a block tending to have a particular skewed frequency distribution, which enables the block-wise adaptive statistical compressor 16 to more efficiently compress data.

After the data block has been clustered and reordered it is ready for compression. The block-wise adaptive statistical stage 16 provides for an optimal level of compression while at the same time minimizing processing time and memory requirements. The block-wise adaptive statistical stage 16 replaces the characters output by the reordering stage 14 with a super-character codeword comprising a variable length Huffman prefix, followed by a fixed length index. The Huffman prefix is determined by treating a plurality of groups of characters as super-character groups. The prefix and index codes for each super-character group are adapted for each data block that is processed by the compressor. The super-character prefix value identifies the group to which a particular character belongs, and the index identifies the individual character of the group. These codes are determined and assigned to each super-character group based upon the actual frequency of occurrence of the characters in each group.

By forming these super-character groups and then calculating the super-character codewords, the block-wise adaptive statistical stage 16 is capable of modeling a data block using a fraction of the amount of data required for a fixed Huffman compressor. This is a significant advantage for block data compressors where the data block is relatively small, such as a few kilobytes. Although the statistical compressor 16 uses the Huffman methodology as described above, this stage could, alternatively, use other types of statistical coding techniques.

Using this super-character technique, and by adapting the groupings for each block of data, the multi-stage lossless data compressor of FIG. 1 combines the advantages of a purely adaptive statistical compressor, for example, the ability to modify the codewords to conform to the actual frequency of occurrence of characters in the data file, with the advantages of a fixed statistical compressor, for example, the ability to process the characters using their actual frequency of occurrence. At the same time, the block-wise adaptive statistical compressor 16 avoids the disadvantages of the adaptive statistical compressor, for example, inefficiency due to less than optimal initialization of the coding model, and the disadvantages of the fixed compressor, for example, the need to pass a large table of frequencies of occurrence.

Although the multi-stage compressor that includes the block-wise adaptive statistical compressor 16, clustering stage 12 and reordering stages 14, could be used with any type of data file and with any type of computer system, a preferred implementation is for compressing E-mail messages to and from a mobile data communication device that communicates via a wireless packet network, such as a two-way paging computer, a wirelessly-enabled palmtop computer, a laptop having a wireless data modem, or any other type of portable device that communicates via a wireless packet data network.

The various stages noted above, and described in more detail in the flowcharts below, are preferably carried out by software instructions executed by a computer or processor that is performing the data compression functions. The code-level detail of these software instructions, whether implemented as subroutines, modules, classes, hierarchies or functions, could be programmed by one of ordinary skill in the art having the teaching, description and diagrams of the present application. These computer software instructions are preferably loaded onto a computer or other programmable apparatus (such as a mobile data communication device as described above) to create a machine, so that the instructions that execute on the computer create means for implementing the functions specified in the block diagrams or flowcharts included with this application. Alternatively, the instructions may be stored in a computer-readable memory that can direct a computer or other programmable apparatus to function in a particular manner, such that the instructions stored in the computer-readable memory produce an article of manufacture including instruction means that implement the function specified in the block diagrams or flowcharts. The computer software instructions may also be loaded onto a computer or other programmable apparatus to cause a series of operational steps to be performed on the computer to produce a computer-implemented process such that the instructions that execute on the computer provide steps for implementing the functions specified in the block diagrams or flowcharts.

Figure 2:
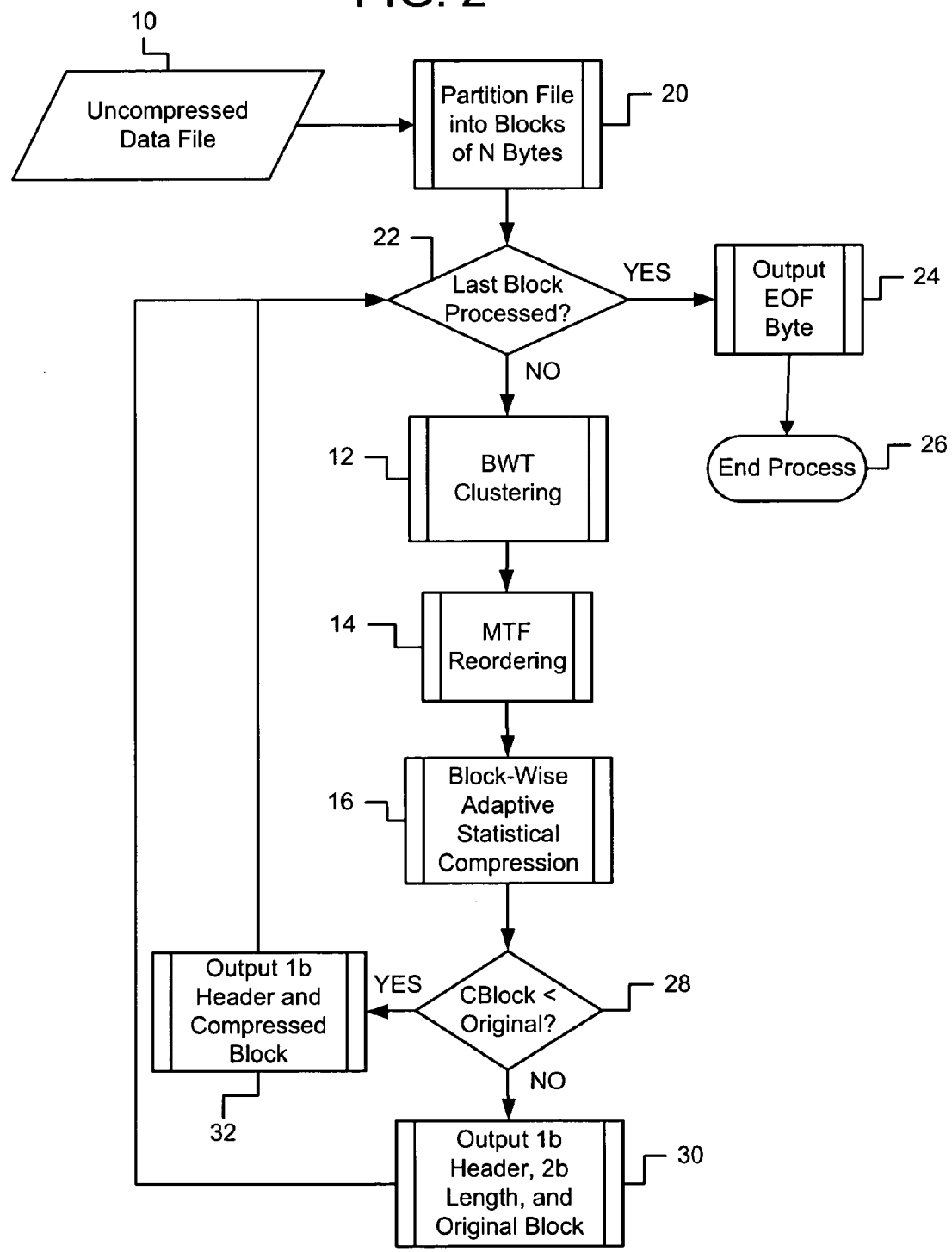
FIG. 2 is a flowchart showing a computer-implemented method of compressing data using the multi-stage lossless data compressor of FIG. 1.

Referring now to FIG. 2, a flowchart showing a computer-implemented method of compressing data using the multi-stage lossless data compressor of FIG. 1 is set forth. Included in this figure are steps of BWT clustering 12, MTF reordering 14, and block-wise adaptive statistical compression 16 corresponding to that described in relation to FIG. 1.

The compression method begins with an uncompressed data file 10. At step 20, this data file 10 is partitioned into data blocks of N bytes each. In a preferred embodiment, N is 4096 bytes, but could, alternatively be another block size. The choice of block size depends on the desired compression ratio (i.e., the size of the compressed file and associated decompression information divided by the size of the original file), the memory capabilities of the device that is executing the computer-implemented method steps, and the size of the packets associated with the packet network, if the method is being used on a device that is communicating via such a network.

At step 22, the method determines whether the last data block in the file has been processed, and if so, outputs an EOF (end-of-file) byte at step 24 and the method ends at step 26. If the last block has not been processed, then control passes to step 12, where the BWT clustering stage transforms the data block as described above, and as discussed more fully below in connection with FIG. 3. Following the BWT clustering transformation, control passes to step 14, where the MTF reordering step reorders the clustered data block as described above. The net effect of the clustering 12 and reordering steps 14 is that the transformed and reordered data block is characterized by an expected skew in the frequency distribution of characters in the data block. This effect allows optimization of the super-character groupings and codewords generated by the block-wise adaptive statistical compressor, thus resulting in better compression ratios.

After the block has been compressed by block-wise adaptive statistical compression 16, as described above, control passes to step 28, where it is determined whether the compressed block ("CBlock") is smaller than the original block. There are certain data files that are not compressible, and in this case control passes to step 30, in which the method outputs a 1-byte header, a 2-byte block length, and then outputs the original data block. If, at step 28, it is determined that the compressed block is smaller than the original, then at step 32 a 1-byte header is output along with the compressed block. From steps 30 or 32, control then passes back to step 22, which determines whether additional data blocks remain to be processed.

Figure 3:
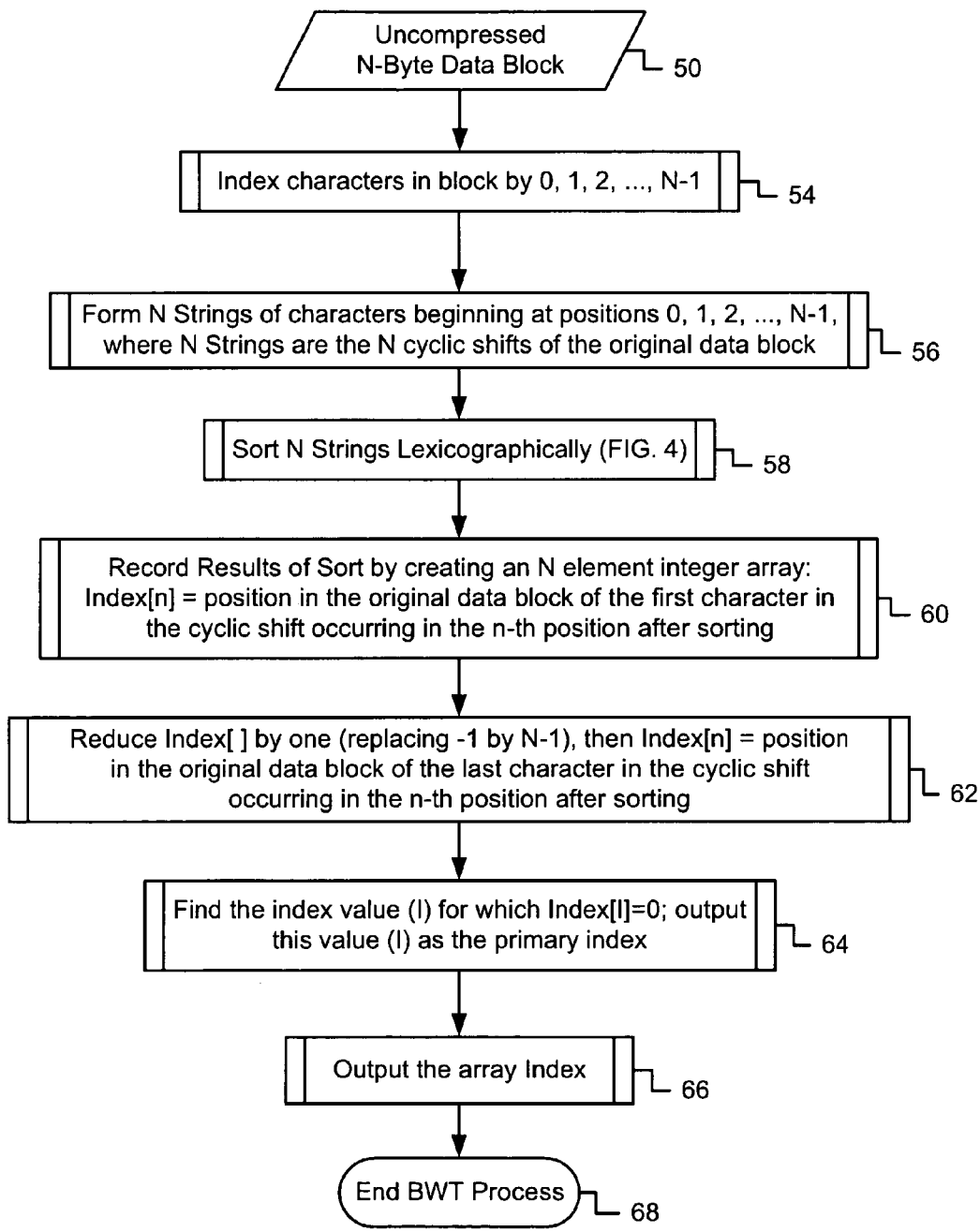
FIG. 3 is a flowchart showing the operation of the BWT clustering stage.

FIG. 3 is a flowchart showing the operation of the BWT clustering stage 12. The BWT clustering stage 12 transforms the characters in the data block so that like characters are grouped or clustered together in certain sub-blocks within the data block. In other words, a single character will tend to occur with a high probability in a small number of locations in the transformed data block and with a low probability in the other locations. Before describing the computer-implemented method steps of the BWT clustering stage 12, it is important to understand the terms "lexicographical order", "cyclic shift", and "primary index."

The term "lexicographical order" refers to the ordering used in creating a dictionary. In the BWT clustering stage 12, the data in the data block is viewed as a plurality of strings of characters, and the strings are each assigned a numeric value. To lexicographically order two strings in the data block, the first characters in each string are compared. If the characters are identical, then compare the second characters in each string, and continue if the second characters are identical to compare the third, fourth, . . . , and Nth characters until two non-identical characters are encountered. When this occurs, the string with the character having the smaller value is placed first in the lexicographical ordering. For example, using ASCII values for the characters in the strings, if the strings "B78Q64" and "B78MT3" are compared, the determination of lexicographical order is based on the fourth characters, "Q" and "M". This is because each string contains the initial three characters "B78." Since "M" has an ASCII value that is less than "Q", the string "B78MT3" would be placed before string "B78Q64" in the lexicographical order.

The term "cyclic shift", when referring to a string of characters contained in the data block, refers to a string of the same length as the original in which each character in the string of characters is moved a fixed number of positions to the left or right. Characters that are shifted beyond the ends of the string are wrapped around to the other side, as in a circular buffer. For example, given the string of characters "ABCDEFG", a cyclic shift to the left by five positions results in the string "FGABCDE".

The term "primary index" is an integer value that is output along with the clustered data block. The primary index provides the location in the clustered data block of the last character of the original (unclustered) block. The decompression device uses this location information to reverse the clustering transformation. For more information on the declustering operation, refer to the previously mentioned SRC Research Report by Burrows and Wheeler, as well as the article in Dr. Dobbs journal by Mark Nelson.

Figure 4:
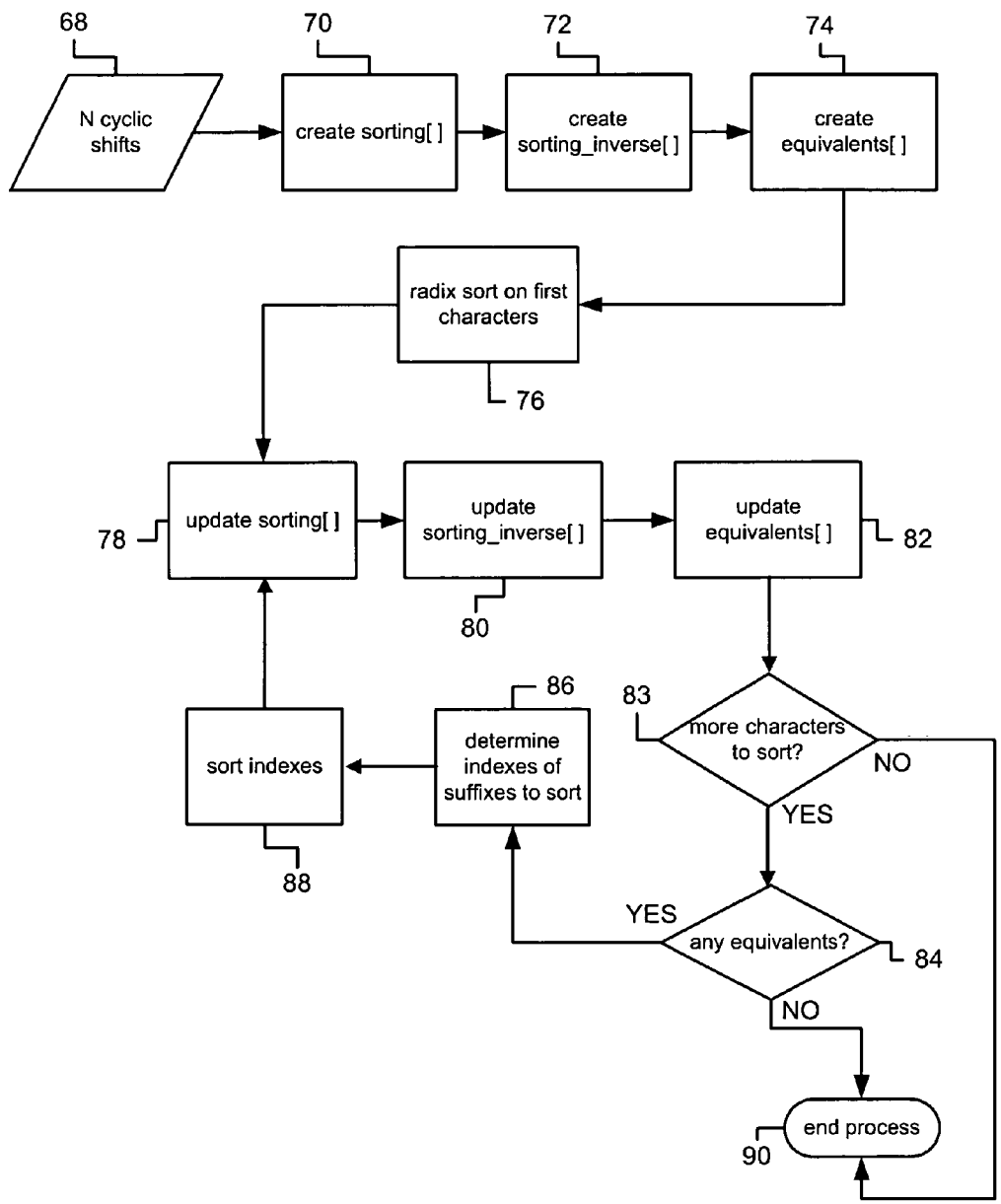
FIG. 4 is a flowchart showing a method of lexicographically sorting cyclic shifts.

Turning now to the BWT clustering method shown in FIG. 3, at step 50 the uncompressed N-byte data block is provided to the computer-implemented method. Control then passes to step 54 which indexes the characters in the data block using the numerical values 0, 1, . . . , N−1. Following the indexing step 54, control passes to step 56 which forms N strings of characters beginning at the index positions 0, 1, . . . , N−1, in which the N strings represent N cyclic shifts of the original data block. Control then passes to step 58 which performs a lexicographical sort of the N strings. An efficient method for performing the lexicographical sort is shown in FIG. 4. At step 60, the results of the lexicographical sort carried out in step 58 are stored in an N-element integer array labeled Index[ ], where each entry in the array represents the position in the original data block of the first character in the cyclic shift occurring in the n-th position after sorting. Following the reordering step, control passes to step 62, in which the values in Index[ ] are reduced by one (with −1 being replaced by N−1), which results in the values stored in Index[n] representing the position in the original data block of the last character in the cyclic shift occurring in the n-th position after sorting. Control then passes to step 64, where the index value (I) for which Index[I]=0 is then found and output as the primary index. At step 66 the characters at position Index[I] for I={0 to N−1} are output in that order, and the process ends at step 68.

Using the BWT clustering stage is particularly advantageous for mobile data communication devices that are communicating via a wireless packet data network due to the asymmetry of operation of this clustering stage, and the realities of data traffic to and from the mobile device. The clustering method discussed above is relatively processor-intensive as compared to the corresponding de-clustering side, which operates very fast. This asymmetry occurs because the clustering algorithm must conduct the lexicographical sorting operation whereas the de-clustering side does not conduct this step. This asymmetrical operation matches well with mobile data communication devices that are generally receiving (and thus decompressing) relatively large data files, and are generally transmitting (and thus compressing) relatively small data files. So, the burden of the lexicographical sort is largely borne by workstations that have much more processing capability than the typical mobile device.

FIG. 4 is a flowchart showing a method for lexicographically sorting cyclic shifts. This method is used at step 58 of the method shown in FIG. 3 to sort the N cyclic shifts 68 of the original data block. The Index[ ] array described in the method shown in FIG. 3 is equivalent to the sorting[ ] array described below. The method initially sorts the cyclic shifts based on the first character of each cyclic shift, and then performs iterations of an index sorting procedure until all the characters in the cyclic shifts have been sorted, or until there are no equivalent cyclic shifts. Equivalent cyclic shifts have a common leading sequence of sorted characters. The $n^{th}$ iteration of the index sorting procedure sorts the equivalent cyclic shifts according to a sort order of the indexes of cyclic shifts starting with the $(2^{n-1}+1)^{th}$ characters of the equivalent cyclic shifts, and then reassigns the indexes of the cyclic shifts accordingly.

The method begins with step 70 of creating an N-element integer array labeled sorting[ ]. When populated, the sorting[ ] array contains the index in the original data block of the first character in each cyclic shift. Each element of the sorting[ ] array effectively refers to one of the cyclic shifts of the original data block. At the end of the method, the indexes in the array are ordered such that the cyclic shifts to which they refer are sorted in lexicographical order. The method continues with step 72 of creating an N-element integer array labeled sorting_inverse[ ]. Once the sorting[ ] array is populated, the index of each character in the original data block appears exactly once in the sorting[ ] array. The sorting_inverse[ ] array contains indexes into the sorting[ ] array for each character in the original data block. The array indexes of the sorting_inverse[ ] array correspond to the indexes of the characters in the original data block, so that sorting_inverse[n] is the index of the array element in sorting[ ] which contains the index n, and sorting[sorting_inverse[n]] always equals n.

The method continues with step 74 of creating an N-element integer array labeled equivalents[ ]. The value in equivalents[n] will be the same as the value in equivalents [n+1] if the corresponding cyclic shifts in the corresponding positions sorting[n] and sorting[n+1] are equivalent for the first $2^{n-1}$ characters, and the value in equivalents[ ] will increase when the corresponding cyclic shift is different. Since the cyclic shifts are now sorted by $2^{n-1}$ characters, the corresponding cyclic shift at position n+1 must always be greater than or equal to the cyclic shift at position n when the first $2^{n-1}$ characters are compared. In one implementation, each element equivalents[n] contains the highest index of the sorting[ ] array where the cyclic shift referred to by the element at that index is considered to be equivalent to the cyclic shift referred to by the element at index n when the sorting[ ] array was last updated. Alternatively, each element in the equivalents[ ] array may contain the number of elements following the element at the corresponding index in the sorting[ ] array that were considered to be equivalent the last time the sorting[ ] array was updated. Other data structures may alternatively be used to specify equivalent cyclic shifts. For example, a bit vector may be used, where ranges of equivalent cyclic shifts are indicated by setting corresponding bits in the bit vector. The arrays labeled sorting[ ], sorting_inverse[ ] and equivalents[ ] may alternatively be labeled differently, or data types other than arrays such as lists or vectors may be used.

The first pass of the sort is a radix sort at step 76 on the first characters in the cyclic shifts. This first pass may alternatively use a different sorting algorithm, provided that the result is that the cyclic shifts are sorting by the first character. Once this step is complete, the sorting[ ] array is updated at step 78 with the indexes of the cyclic shifts in the original data block, as described above, where the array is sorting by the first characters of the cyclic shifts. The sorting_inverse[ ] array is then updated at step 80, as described above. The equivalents[ ] array is then updated at step 82, with indexes as described above. On the first pass, there are equivalents if there are cyclic shifts that begin with the same character. The method continues with step 83, which determines if there are more characters in the cyclic shifts to sort. If the original data block had only one character, then the cyclic shifts are sorted and the method terminates at step 90. If it is determined at step 83 that there are more characters to sort, then the method continues with the step 84 of determining whether there are any elements in the sorting[ ] array that were considered to be equivalent in the last time that the sorting[ ] array was updated. This determination is made by examining the equivalents[ ] array. If no equivalents are found, then the cyclic shifts have been sorted, and the method terminates at step 90.

If there are equivalents found at step 84, then the method continues with step 86. For each set of equivalents found at step 84, the cyclic shifts must be further sorted. As described above, the sort continues by comparing the characters in the cyclic shifts that follow the characters that were the same. The first time that step 86 is performed, the cyclic shifts have been sorted based on the first character at step 76, so the second characters in the cyclic shifts are considered. Rather than compare the characters directly, the indexes of the characters in the sorting[ ] array may be compared, since the sorting[ ] array is already sorted by the first character, and for each of the second characters in the cyclic shifts, there is a cyclic shift that starts with that character.

For each cyclic shift to be sorted further, the sorting[ ] array is used to determine the position in the original data block of the first character in that cyclic shift. By adding one to this index modulo N, since the first character has already been sorted, and then retrieving the element at that index in the sorting_inverse[ ] array, the index into the sorting[ ] array of the cyclic shift starting at the second character is determined.

Once the indexes to be sorted are determined at step 86, the indexes are sorted at step 88. The sort of indexes at this step is performed using any known algorithm for sorting integers. Indexes that were considered to be equivalent at step 82 may be considered to be equivalent for the purpose of this sort. Therefore, if the equivalents[ ] array specifies that two indexes are equivalent, then the order of the two indexes relative to each other after the sorting at step 88 does not affect the outcome of the method. The result of the sort at step 88 is then used to update the sorting[ ] array at step 78. The sorting[ ] array is updated so that the indexes of cyclic shifts that were considered to be equivalent at step 84 are reordered, if necessary, based on the order of their second characters determined at step 88. The sorting[ ] array is now sorted by the first two characters of the cyclic shifts. The sorting_inverse[ ] array is then updated at step 80 according to the contents of the updated sorting[ ] array. The equivalents[ ] array is then updated at step 82. There remain equivalents at this step if two or more of the indexes that were sorted at stage 88 were considered to be equivalent the last time that the equivalents[ ] array was updated. The second time that step 82 is performed the equivalents are cyclic strings that start with the same two characters.

The method once again continues with step 83, which determines if there are more characters in the cyclic shifts to sort. If the original data block had only two characters, then the cyclic shifts are sorted and the method terminates at step 90. If it is determined at step 83 that there are more characters to sort, then the method continues at step 84, and determines whether there are still equivalents in the sorting[ ] array, using the equivalents[ ] array. If there are no equivalents, then the cyclic shifts have been sorted, and the method terminates at step 90. If there are equivalents found the second time that step 84 is performed, then the method once again continues at step 86. The cyclic shifts have already been sorted by the first two characters, so the third characters of cyclic shifts that are considered to be equivalent are considered. However, since the sorting[ ] array is already sorted by the first two characters of the cyclic shifts, and the third and fourth characters in each cyclic shift to be sorted are therefore the same as the first two characters of a different cyclic shift that is referenced in the sorting[ ] array, then the third and fourth characters of the cyclic shifts to be sorted further can be considered at the same time.

For each cyclic shift to be sorted further, the sorting[ ] array is used to determine the index in the original data block of the first character of that cyclic shift. By adding two to this index modulo N, since the first two characters have already been sorted, and then retrieving the element at that index in the sorting_inverse[ ] array, the index into the sorting[ ] array of the third character in the cyclic shift is determined.

The indexes are then sorted at step 88, as described above. Since the sorting[ ] array was already sorted by the first two characters of the cyclic shifts, and the third and fourth characters are now being sorted, as explained above, step 88 will now result in the cyclic shifts being sorted by their first four characters. Steps 78, 80, and 82 are then performed as described above. If it is determined at step 83 that the original data block contains no more than four characters, or if there are more than four characters in the original data block but no equivalents are found at step 84, then the cyclic shifts are sorted, and the method ends at step 90. If step 83 determines that there are more characters to sort, and equivalents are once again found at step 84, then the method continues at step 86. The sorting[ ] array is now sorted by the first four characters of the cyclic shifts, so using the sorting[ ] and sorting_inverse[ ] arrays as described above, step 86 can determine indexes to sort at step 88 that will result in the sorting[ ] array being sorted by the first eight characters at step 78. In general, the $n^{th}$ iteration of step 78 results in the sorting[ ] array being sorted by the leading $2^{(n-1)}$ characters of the cyclic shifts. The method ends at step 90 when it is determined at step 83 that there are no more characters to sort, since it is the $m^{th}$ iteration and there are not more than $2^{m-1}$ characters the original data block, or it is determined at step 84 that there are no equivalents in the sorting[ ] array. At this point the cyclic shifts have been fully sorted.

This method offers improvements over existing methods of lexicographically sorting strings when it is used on cyclic shifts, since it takes advantage of the cyclic nature of the data by using the results of previous sorting iterations in subsequent iterations. The method requires less time to sort cyclic strings, particularly if they contain redundant data, such as repeating characters, since it requires fewer comparisons than does a typical lexicographical sorting method that is not optimized for sorting cyclic shifts.

The following example illustrates the method shown and described in relation to FIG. 4. The original data block whose cyclic shifts are to be ordered is "bbacbb". The cyclic shifts of the original data block are "bbacbb", "bacbbb", "acbbbb", "cbbbba", "bbbbac" and "bbbacb". After steps 76 through 82, the sorting[ ] array is sorted by one character, and contains the indexes 2, 0, 1, 4, 5 and 3. The sorting_inverse[ ] array contains the indexes 1, 2, 0, 5, 3 and 4. The equivalents[ ] array contains the indexes 0, 4, 4, 4, 4 and 5, since the shifts corresponding to indexes 1 though 4 of the sorting[ ] array start with the same character (i.e. the letter "b"). Step 83 determines that there are more characters to sort, and step 84 determines that there are equivalents, so the method continues at step 86.

From the equivalents[ ] array, it is determined that the cyclic shifts corresponding to indexes 1, 2, 3, 4 in the sorting[ ] array are equivalent, since equivalents[n] is 4 for n=1, 2, 3, 4. In the sorting[ ] array, the elements sorting[n] for n=1, 2, 3, 4 are 0, 1, 4, 5. As described above, the second character in each equivalent cyclic shift is determined by adding one to sorting[n] (modulo N) for each equivalent cyclic shift, and then retrieving the elements sorting_inverse [sorting[n]+1], to thereby determine, at step 86, the indexes to be sorted. Adding one to 0, 1, 4, 5 (modulo N) gives 1, 2, 5, 0, which index the elements 2, 0, 4 and 1 in sorting_inverse[ ]. The elements index the positions of the second characters of the equivalent cyclic shifts in the sorting[ ] array, representing the characters that follow the letter "b" in each of the four occurrences of that letter, and are used as the sorting values for n=1, 2, 3, 4 positions in the sorting array. As apparent, 2 is key for 0; 0 is key for 1; 4 is a key for 4; and 1 is a key for 5.

At step 88, these indexes are sorted by the integer value into the order 0 (key for 1), 1 (key for 5), 2 (key for 0), and 4 (key for 4). The sorted indexes are used to reorder the elements in the sorting[ ] array at positions 1 through 4 according to the sorted order of the second characters in the equivalent shifts 1, 5, 0, 4, so that the sorting[ ] array after step 78 contains the elements 2, 1, 5, 0, 4 and 3. After step 80, sorting_inverse[ ] contains the elements 3, 1, 0, 5, 4 and 2. The second characters of the cyclic shifts corresponding to indexes 2, 3, and 4 of the sorting[ ] array were, in the previous iteration of steps 78 through 82, associated with sorting[ ] array indexes 1, 2, and 4, which were determined to be equivalent by the equivalents[ ] array in the previous iteration. These represent the three occurrences of the letters "bb". Therefore, after step 82, the equivalents[ ] array contains the elements 0, 1, 4, 4, 4 and 5. Step 83 determines that there are more characters to sort, and step 84 determines that there are equivalents, so the method continues at step 86.

From the equivalents[ ] array, it is determined that the cyclic shifts corresponding to indexes 2, 3 and 4 in the sorting[ ] array are equivalent, since equivalents[n] is 4 for n=2, 3, 4. In the sorting[ ] array, the elements sorting[n] for n=2, 3, 4 are 5, 0, 4. As described above, the third character in each equivalent cyclic shift is determined by adding two to sorting[n] (modulo N) for each equivalent cyclic shift, and then retrieving the elements sorting_inverse[sorting[n]+2], to thereby determine, at step 86, the indexes to be sorted. Adding two to 5, 0, 4 (modulo N) gives 1, 2, 0 which index the elements 1, 0, and 3 in sorting_inverse[ ]. These elements index the positions of the third characters of the equivalent cyclic shifts in the sorting[ ] array.

At step 88, these indexes are sorted into the order 0, 1, 3. The sorted indexes are used to reorder the elements in the sorting[ ] array at positions 2 through 4 according to the sorted order of the third characters in the equivalent shifts, so that the sorting[ ] array after step 78 contains the elements 2, 1, 0, 5, 4 and 3. After step 80, sorting_inverse[ ] contains the elements 2, 1, 0, 5, 4 and 3. Since none of the cyclic shifts corresponding to the third characters of the equivalent cyclic shifts are determined to be equivalent in the previous iteration, the equivalents[ ] array contains the elements 0, 1, 2, 3, 4 and 5 after step 82. Step 83 determines that there are more characters to sort, so the method continues at step 84. It is determined at step 84 that there are no equivalents, since equivalents[n] for n=0, 1, 2, 3, 4, 5 are unique. The method then ends at step 90, and the cyclic shifts are sorted. The order of cyclic shifts specified by the sorting[ ] array is "acbbbb", "bacbbb", "bbacbb", "bbbacb", "bbbbac", " " and "cbbbba", which can be verified to be in lexicographical order.

The above example illustrates the efficiency of this method. Since there are two cyclic shifts that start with the same three characters, namely "bbbacb" and "bbbbac", a typical lexicographical sort must compare 4 characters of these strings, whereas the present method effectively only referenced these cyclic shifts 3 times (specifically, once for the radix sort and two iterative passes). Since the effective number of characters doubles with each pass, the time saving is increased when the cyclic shifts have longer matching initial sequences.

A method of lexicographically sorting cyclic shifts may contain fewer, additional, or differently ordered steps than shown in FIG. 4. For example, instead of updating the sorting[ ], sorting_inverse [ ], and equivalents[ ] arrays in the sequence shown, they may be updated in a different order or concurrently. As another example, tests 83 and 84 might be performed before the updating of one or more of the arrays sorting[ ], sorting_inverse[ ], and equivalents[ ].

In addition, the method of lexicographically sorting cyclic shifts may alternatively sort the cyclic shifts using the elements of the equivalents[ ] array as sort keys for the cyclic shifts. Since the indexes of the equivalents[ ] array correspond to the indexes of the cyclic shifts of the original data block, sorting the cyclic shifts using the elements of the equivalents[ ] array as sort keys results in the cyclic shifts being sorted as they are when the sorting_inverse[ ] array is used. When sorting based on the equivalents[ ] array rather than the sorting_inverse[ ] array, an additional bit vector is used to track ranges of equivalent cyclic shifts after each sorting iteration. The bit vector allows the equivalents[ ] array to be updated in place after each sorting iteration.

Figure 5:
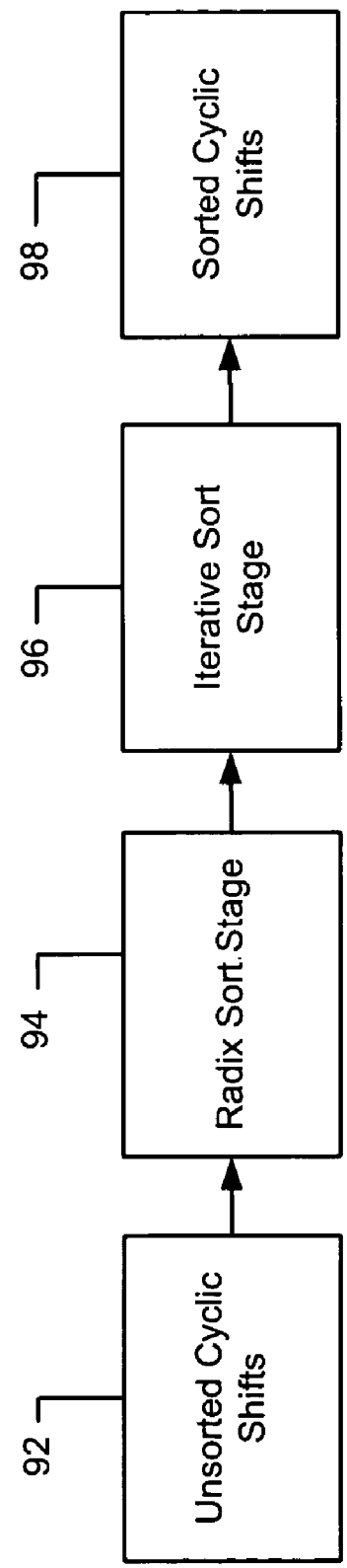
FIG. 5 is a block diagram of a lexicographical sorter.

FIG. 5 is a block diagram of a lexicographical sorter. The sorter is used by the data compressor shown in FIG. 1 in the BWT clustering stage 12. The sorter orders the unsorted cyclic shifts 92 of a data block into sorted cyclic shifts 98 using a radix sort stage 94 and an iterative sort stage 96.

The radix sort stage 94 receives the unsorted cyclic shifts 92 of a data block as input. The unsorted cyclic shifts 92 are then ordered using a radix sort on the first character of each cyclic shift. The radix sort stage 94 outputs the cyclic shifts sorted based on the first characters of the cyclic shifts. Alternatively, a sorting algorithm other than a radix sort may be used, provided that the algorithm results in the cyclic shifts being sorted by their first characters.

The iterative sort stage 96 receives the cyclic shifts of a data block that are sorted based on the first character, orders the cyclic shifts, and then outputs the cyclic shifts 98 sorted in lexicographical order. The ordering performed by the iterative sort stage 96 is accomplished by multiple sorting iterations, each one resulting in the cyclic shifts being sorted by a greater number of characters. Each iteration need only sort the cyclic shifts that were considered equivalent by the previous iteration. For example, since the radix sort stage 94 sorts the cyclic shifts based on their first characters, the first iteration of the iterative sort stage 96 need only sort amongst cyclic shifts that start with the same character. If an iteration of the iterative sort stage 96 sorts the cyclic shifts based on the first n characters, then the next iteration need only sort amongst cyclic shifts that have the same first n characters. The iterations continue until the cyclic shifts are fully sorted.

Each iteration of the iterative sort stage 96 uses the results of the previous iteration, except for the first iteration, which uses the results from the radix sorting stage 94. An iteration sorts additional characters in the cyclic shifts by locating the characters to be sorted in the results of the previous iteration. This is possible due to the cyclic nature of the cyclic shifts. For example, the first iteration of the iterative sort stage 96 sorts the cyclic shifts by two characters, since the cyclic shifts have been sorted by the first character after the radix sort stage 94, and each of the second characters in the cyclic shifts necessarily appear as the first character in a different cyclic shift. By using the results of the radix sort stage 94, the first iteration determines the sorted order of the second characters of the cyclic shifts that were considered equivalent by the radix sorting stage 94, and reorders the cyclic shifts accordingly. This results in the cyclic shifts being sorted by the first two characters after the first iteration of the iterative sort stage 96.

Similarly, the second iteration of the iterative sort stage 96 sorts the cyclic shifts by four characters, since the cyclic shifts have been sorted by the first two characters after the first iteration, and each of the sequences of the third and fourth characters in the cyclic shifts appear as the first two characters a different cyclic shift, and thus have already been sorted by the previous iteration. Using the results of the first iteration, the second iteration orders the cyclic shifts that were considered to be equivalent by the first iteration. This results in the cyclic shifts being sorted by the first four characters. As apparent, after the $n^{th}$ iteration of the iterative sort stage 96 the cyclic shifts are sorted by $2^n$ characters. The cyclic shifts are considered to be sorted when there are no cyclic shifts that are considered to be equivalent after an iteration, or if all of the characters in the cyclic shifts have been sorted. When the cyclic shifts are sorted, the iterative sort stage 96 outputs the sorted cyclic shifts 98 in lexicographical order.

When the method shown in FIG. 4 is implemented by the lexicographical sorter shown in FIG. 5, the steps 70 through 76 are implemented by the radix sort stage 94. Steps 78 through 88 are performed by the iterative sort stage 96.

Final Comments. Thus, methods and apparatus for lexicographically sorting cyclic data have been described. In one illustrative example, a method of lexicographically sorting data includes the acts of receiving a set of N cyclic shifts of N characters identifiable by an array of indexes {0, 1, 2, . . . , N}; sorting the set of cyclic shifts based on a comparison of a first character of each cyclic shift; and for an nth sorting iteration of the set of cyclic shifts, where n=1, 2, 3, . . . , up to $2^n$>N: sorting at least a subset of the cyclic shifts which are identifiable by a subset array of indexes in the array in accordance with a previous sort of cyclic shifts associated with the subset array of indexes plus $2^{(n-1)}$*modulo(N); and repeating the sorting for a next nth sorting iteration as necessary until the set of cyclic shifts are lexicographically sorted.

The above description relates to examples of the present invention only. Many variations on the invention will be obvious to those knowledgeable in the field, and such obvious variations are within the scope of the invention as described and claimed, whether or not expressly described. For example, although the system and method of lexicographically sorting cyclic shifts is shown as a component of a multi-stage data compressor, the system and method may be used to sort any cyclic data as is required by a compressor or other system. Also, although FIG. 1 shows the BWT clustering stage 12 as a component of a multi-stage data compressor that also includes an MTF reordering stage and a block-wise adaptive statistical stage, BWT clustering including the system of lexicographically sorting cyclic data may also be used in other compression systems, such as bzip file compression.

What is claimed is:

1. A method of lexicographically sorting data for use by a data compressor to produce compressed data, the method comprising the acts of:

receiving a set of N cyclic shifts of N characters;

creating a sorting array of indexes $\{0, 1, 2, \ldots, N-1\}$ for identifying the set of N cyclic shifts of N characters, wherein each array element of the sorting array is the index of the array element in the array;

creating an inverse sorting array of indexes, such that each array element at index i of the inverse sorting array is the index of the array element in the sorting array containing the index i;

sorting the set of cyclic shifts based on a first character of each cyclic shift, where the array elements in the soiling a my are updated in accordance with the sorting of the set of cyclic shifts and the array elements in the inverse sorting array are updated such that each array element at index i of the inverse sorting array is the index of the array element in the sorting array containing the index i;

iteratively sorting the set of cyclic shifts by, for an nth sorting iteration of the set of cyclic shifts, where n=1, 2, 3, . . . , up to $2^n > N$:

identifying a subset of cyclic shifts which are equivalent for the first $2^{(n-1)}$ characters;

updating indexes of the sorting array by:

for each array element of the sorting array associated with the identifed subset of cyclic shifts, retrieving the array element of the inverse sorting array indexed by the array element of the sorting array plus $2^{(n-1)}$ (modulo N);

sorting the retrieved array elements from the inverse sorting array; and ordering the array elements of the sorting array corresponding to the sorting of the retrieved array elements from the inverse sorting array;

updating the array elements of the inverse sorting array based on the updated array elements of the sorting array, such that each array element at index i of the inverse sorting array is the index of the array element in the sorting array containing the index i; and repeating the iterative sorting steps for a next nth sorting iteration as necessary until the set of cyclic shifts are lexicographically sorted for the data compressor.

2. The method of claim 1, wherein the act of sorting based on the first character comprises a radix sort.

3. The method of claim 1, wherein the method is included in a Burrows-Wheeler Transform (BWT) clustering procedure.

4. The method of claim 1, wherein the data compressor is embodied in a computer of a communication network.

5. The method of claim 1, wherein the data compressor is embodied in a mobile communication device which is operative in a wireless communication network.

6. A computer program product, comprising:

memory;

computer instructions stored in the memory; and the computer instructions being executable by a processor for lexicographically sorting data for use by a data compressor to generate compressed data by:

receiving a set of N cyclic shifts of N: characters;

creating a sorting array of indexes $\{0, 1, 2, \ldots, N-1\}$ for identifying the set of N cyclic shifts of N characters, wherein each array element of the sorting array is the index of the array element in the array;

creating an inverse sorting array of indexes, such that each array element at index i of the inverse sorting array is the index of the array element in the sorting array containing the index i;

sorting the set of cyclic shifts based on a first character of each cyclic shift, where the array elements in the sorting array are updated in accordance with the sorting of the set of cyclic shifts and the array elements in the inverse sorting array are updated such that each array element at index i of the inverse sorting array is the index of the array element in the sorting array containing the index i;

iteratively sorting the set of cyclic shifts by, for an nth sorting iteration of the set of cyclic shifts, where n=1, 2, 3, . . . , up to $2^n > N$:

identifying a subset of cyclic shifts which are equivalent for the first $2^{(n-1)}$ characters;

updating indexes of the sorting array by:

for each array element of the sorting array associated with the identified subset of cyclic shifts, retrieving the array element of the inverse sorting array indexed by the array element of the sorting array plus $2^{(n-1)}$ (modulo N);

sorting the retrieved array elements from the inverse sorting array; and ordering, the array elements of the sorting array corresponding to the soiling of the retrieved array elements from the inverse sorting array;

updating the array elements of the inverse sorting array based on the updated array elements of the sorting array, such that each array element at index i of the inverse sorting array is the index of the array element in the sorting array containing the index i; and repeating the iterative sorting steps for a next nth sorting iteration as necessary until the set of cyclic shifts are lexicographically sorted for the data compressor.

7. The computer program product of claim 6, wherein the act of sorting based on the comparison of the first character comprises a radix sort.

8. The computer program product of claim 6, wherein the computer instructions are included in a Burrows-Wheeler Transform (BWT) clustering procedure.

9. The computer program product of claim 6, wherein a computer embodies the processor having the data compressor.

10. The computer program product of claim 6, wherein a mobile communication device embodies the processor having the data compressor.

11. A system for communicating data, comprising:
a wireless packet data network;
a mobile communication device which operates in the wireless packet data network;
a computer coupled to the wireless packet data network;
the computer having a data compressor adapted to generate compressed data which is communicated to the mobile communication device;
the computer having a lexicographical sorter adapted to lexicographically sort data for use in the data compressor by:
  receiving a set of N cyclic shifts of N characters;
  creating a sorting array of indexes {0, 1, 2, . . . , N−1} for identifying the set of N cyclic shifts of N characters, wherein each array element of the sorting array is the index of the array element in the array;
  creating an inverse sorting array of indexes, such that each array element at index i of the inverse sorting array is the index of the array element in the sorting array containing the index i;
  sorting the set of cyclic shifts based on a first character of each cyclic shift, where the array elements in the sorting array are updated in accordance with the sorting of the set of cyclic shifts and the array elements in the inverse sorting array are update such that each array element at index i of the inverse sorting array is the index of the array element in the sorting array containing the index i;
  iteratively sorting the set of cyclic shifts by, for an nth sorting iteration of the set of cyclic shifts, where n=1, 2, 3, . . . , up to $2^n > N$:
    identifying a subset of cyclic shifts which are equivalent for the first $2^{(n-1)}$ characters;
    updating indexes of the sorting array by:
      for cad array element of the sorting array associated with the identified subset of cyclic shifts, retrieving the array element of the inverse sorting array indexed by the array element of the sorting array plus $2^{(n-1)}$ (modulo N);
      sorting the retrieved array elements from the inverse sorting array; and
      ordering the array elements of the sorting array corresponding to the sorting of the retrieved array elements from the inverse sorting array;
    updating the array elements of the inverse sorting array based on the updated array elements of the sorting array, such that each array element at index i of the inverse sorting array is the index of the array element in the sorting array containing the index i; and
  repeating the iterative sorting steps for a next nth sorting iteration as necessary until the set of cyclic shifts are lexicographically sorted for the data compressor.

12. The system of claim 11, wherein the act of sorting based on the first character comprises a radix sort.

13. The system of claim 11, wherein the data compressor includes a Burrows-Wheeler Transform (BWT) clustering procedure.

* * * * *